(12) United States Patent
Basquin et al.

(10) Patent No.: US 12,137,528 B2
(45) Date of Patent: Nov. 5, 2024

(54) DISPLAY DEVICE AND MANUFACTURING METHOD

(71) Applicant: Faurecia Innenraum Systeme GmbH, Hagenbach (DE)

(72) Inventors: Guillaume Basquin, Hagenbach (DE); Christophe Coupe, Hagenbach (DE); Edouard Da Silva, Hagenbach (DE)

(73) Assignee: Faurecia Innenraum Systeme GmbH, Hagenbach (DE)

( * ) Notice: Subject to any disclaimer, the term of this patent is extended or adjusted under 35 U.S.C. 154(b) by 410 days.

(21) Appl. No.: 17/542,597

(22) Filed: Dec. 6, 2021

(65) Prior Publication Data

US 2022/0183171 A1 Jun. 9, 2022

(30) Foreign Application Priority Data

Dec. 9, 2020 (DE) ...................... 10 2020 132 837.0

(51) Int. Cl.
*H05K 5/00* (2006.01)
*B32B 7/12* (2006.01)
*B32B 37/12* (2006.01)
*H05K 5/02* (2006.01)
*H05K 9/00* (2006.01)

(52) U.S. Cl.
CPC ............. *H05K 5/0243* (2013.01); *B32B 7/12* (2013.01); *B32B 37/1284* (2013.01); *H05K 5/0017* (2013.01); *H05K 9/0054* (2013.01); *B32B 2307/412* (2013.01); *B32B 2457/208* (2013.01)

(58) Field of Classification Search
None
See application file for complete search history.

(56) References Cited

U.S. PATENT DOCUMENTS

| 10,043,440 | B2 | 8/2018 | Schmittat |
| 2014/0176872 | A1* | 6/2014 | Miyazaki .......... G02F 1/133615 349/65 |
| 2016/0011021 | A1 | 1/2016 | Masuda et al. |
| 2017/0060346 | A1* | 3/2017 | Park ..................... G06F 3/0425 |
| 2017/0206831 | A1 | 7/2017 | Schmittat |
| 2019/0001637 | A1 | 1/2019 | Ito et al. |
| 2019/0232887 | A1 | 8/2019 | Benchikhi et al. |
| 2020/0052242 | A1 | 2/2020 | So et al. |

FOREIGN PATENT DOCUMENTS

| DE | 102017100512 A1 | 7/2017 |
| DE | 202017106916 A1 | 2/2019 |
| DE | 102019200223 A1 | 7/2020 |
| JP | 2014174308 A | 9/2014 |

* cited by examiner

*Primary Examiner* — Anthony Q Edwards
*Assistant Examiner* — Rashen E Morrison
(74) *Attorney, Agent, or Firm* — Carlson, Gaskey & Olds, P.C.

(57) ABSTRACT

A display device for vehicle interiors includes a screen having an active front screen surface comprising a main area and a marginal area, and a decorative layer covering the marginal area and not covering the main area. The decorative layer is configured such that in a non-switched-on state of the screen in the marginal area, the marginal area is not visible through the decorative layer In a switched-on state of the marginal area, light emitted from the marginal area is visible through the decorative layer. Furthermore, a method of manufacturing such a display device is provided.

19 Claims, 2 Drawing Sheets

DISPLAY DEVICE AND MANUFACTURING METHOD

CROSS-REFERENCE TO RELATED APPLICATIONS

This application is a U.S. non-provisional application claiming the benefit of German Application No. 10 2020 132 837.0, filed on Dec. 9, 2020, which is incorporated herein by reference in its entirety.

TECHNICAL FIELD

The disclosure relates to a display device for vehicle interiors, comprising a screen having an active front screen surface.

Furthermore, the disclosure relates to a method of manufacturing such a display device.

BACKGROUND

Display devices having a screen for vehicle interiors are known.

Such display devices are used to purposefully provide vehicle occupants, in particular a driver, with information, for example image contents of a multimedia application and/or a map of a navigation system. The input is usually made by using separate input elements, such as a joystick or buttons on the steering wheel, or directly via the screen if it has a touchscreen functionality.

One disadvantage of these display devices is that they often form a harsh contrast to the usual vehicle interior design. They thus appear like a foreign body and do not fit harmoniously into the interior design. Furthermore, a large number of input elements can interfere with a driver's focus, especially if the input elements themselves have display elements which can distract or irritate the driver.

SUMMARY

The subject disclosure provides a display device for vehicle interiors which fits particularly harmoniously into a vehicle interior design and effectively supports and does not unnecessarily distract a driver. The subject disclosure also provides a method of manufacturing such a display device.

A display device for vehicle interiors includes a screen having an active front screen surface comprising a main area and a marginal area, and a decorative layer covering the marginal area and not covering the main area. The decorative layer is configured such that in a non-switched-on state of the screen in the marginal area, the marginal area is not visible through the decorative layer, and in a switched-on state of the marginal area, the light emitted from the marginal area is at least partially visible through the decorative layer. The screen surface is here the active area of the screen, which is designed to display image content and faces the viewer or the vehicle interior.

It has been recognized that via the decorative layer, a smooth transition may be provided from the main area, i.e. the area of the screen surface which is exposed or not covered by the decorative layer, to surfaces adjacent to the display device, as a result of which the display device fits particularly harmoniously into the design of the vehicle interior.

By not covering the main area of the screen surface with the decorative layer, the view from the vehicle interior to the main area is unobstructed, so that image contents displayed in the main area are visible in a particularly high image quality.

At the same time, the marginal area provides a display for information which can be displayed specifically when needed and thus does not unnecessarily flood the driver with information and in this way distract or disturb the driver. As the decorative layer covers the marginal area, only the displayed image contents in the marginal area are visible to an observer in the vehicle interior through the decorative layer, while the screen surface in this area is otherwise substantially invisible. In contrast to conventional display elements, which are visible to an observer in the vehicle interior at any time, the number of visible display elements can thus be purposefully adapted or reduced to specific requirements.

The screen may be an LCD, TFT, LED, OLED or QLED display.

The decorative layer may be formed from or with leather, a textile material, wood, plastic, metal and/or a material with black panel technology.

It can be formed such that, in the switched-on state of the marginal area, at least 30% of the electromagnetic radiation emitted by the marginal area from the wavelength spectrum of visible light is transmitted through the decorative layer.

Additionally or alternatively, the decorative layer may have a transparency of less than 50% in the visible spectral range.

In all cases, the decorative layer may be perforated for this purpose, in particular micro-perforated.

The decorative layer can be formed from a material which is also provided for other surfaces in the vehicle interior, in particular for surfaces adjacent to the display device.

In a further option, the display device has a transparent protective layer for the screen which extends over the main area and which is directly adjacent to the decorative layer. In this way, the display device may include a screen the front screen surface of which is itself not sufficiently robust to form a surface of the display device.

Here, it may be provided that the transparent protective layer overlaps with the decorative layer such that the decorative layer is arranged in the overlapping area between the transparent protective layer and the screen surface. This has the advantage of particularly effectively providing a smooth transition from the screen directly visible through the transparent protective layer to the decorative layer, the display device thus fitting harmoniously into the vehicle interior design.

According to one option, the display device has one or more touch-sensitive and/or pressure-sensitive switching elements arranged between the decorative layer and the marginal area. Additionally or alternatively, the touch-sensitive and/or pressure-sensitive switching elements may be integrated into the decorative layer in an area opposite the marginal area. This allows a vehicle occupant to make inputs directly via the switching elements which are arranged in the corresponding area of an image element displayed through the decorative layer. By providing the touch-sensitive and/or pressure-sensitive switching elements in and/or below the decorative layer, these can be designed to be particularly unobtrusive to vehicle occupants so that they do not interfere with the design of the vehicle interior or unnecessarily distract the driver.

The display device may further comprise one or more masking elements arranged between the decorative layer and the marginal area. Additionally or alternatively, the one or more masking elements may be integrated into the decorative layer in an area opposite the marginal area. In all cases, the masking elements are designed to partially shield the light emitted by the marginal area from the decorative layer or the vehicle interior. The masking elements each have a corresponding image element which is visible to a vehicle occupant when the masking element is illuminated by the marginal area. The marginal area can be used as a kind of light box for the masking element, as a result of which the image element can be displayed with greater brightness than if the image element is shown or generated directly as image content in the marginal area.

In one option, the decorative layer in the immediate area of the one masking element or the plurality of masking elements has a transparency of at most 15% in the visible spectral range. Preferably, the transparency in the area of one masking element is between 2% and 8%, in particular of 4%, in the visible spectral range. This relatively low transparency ensures that the masking element cannot be seen through the decorative layer without backlighting. If the masking element is backlit by the marginal area, then the image element is visually perceptible.

Furthermore, it may be provided that the decorative layer has a transparency of a minimum of 35% and a maximum of 45% in the visible spectral range, in particular in areas without a masking element or in embodiments having no masking elements. In this range of transparency, it is ensured that image contents displayed in the marginal area are clearly recognizable through the decorative layer for an observer in the vehicle interior. At the same time, the decorative layer with a transparency in this range reliably obscures the screen in an opaque manner, i.e. light which is not generated by the screen for displaying image contents, such as light incident from outside which is reflected or scattered by the screen surface, is attenuated by the decorative layer to such an extent that the screen surface in this area is not visible to the naked eye for an observer in the vehicle interior.

According to a further option, the display device has a transparent support which is arranged at least in sections between the decorative layer and the screen surface. In particular, the transparent support thus forms an enclosure for the screen. The transparent support is a stable layer which protects the screen surface in the marginal area, in particular with respect to pressure applied to the decorative layer, without substantially impairing the light emitted by the marginal area.

Here, it may be provided that the transparent support has an edge which faces the main area and is arranged between the vehicle interior and the marginal area of the screen surface. Here, the display device has a light-proof layer which shields the edge of the transparent support from light from the main area. This ensures that the decorative area is not illuminated by light from the main area or impaired by so-called light bleeding. This has the advantage that image contents to be displayed through the decorative area can be displayed independently of the light emitted via the main area and in a much more pronounced manner.

Furthermore, the display device may have a sealing element which seals a gap between the screen and the transparent support. In particular, the sealing element is arranged between the decorative layer and the side of the screen having the screen surface. By using the sealing element, the space adjoined by the screen surface can be reliably sealed, for example to prevent soiling of the screen surface or to retain a medium applied to the screen surface, in particular an optically clear liquid adhesive, also referred to as a liquid optically clear adhesive (LOCA).

According to the disclosure, a method of manufacturing a display device according to the disclosure having a transparent support and a sealing element is also provided for achieving the aforementioned object. The method comprises the steps of:

a) applying a liquid optically clear adhesive (LOCA) to the screen surface, the liquid adhesive flowing at least in sections into the gap between the screen and the transparent support, and b) attaching a transparent protective layer for the screen, which extends over the main area and which is directly adjacent to the decorative layer, by bonding the transparent protective layer to the screen by using the previously applied liquid optically clear adhesive.

In this way, the display device can be reliably manufactured with little effort.

DETAILED DESCRIPTION

Figure 1:
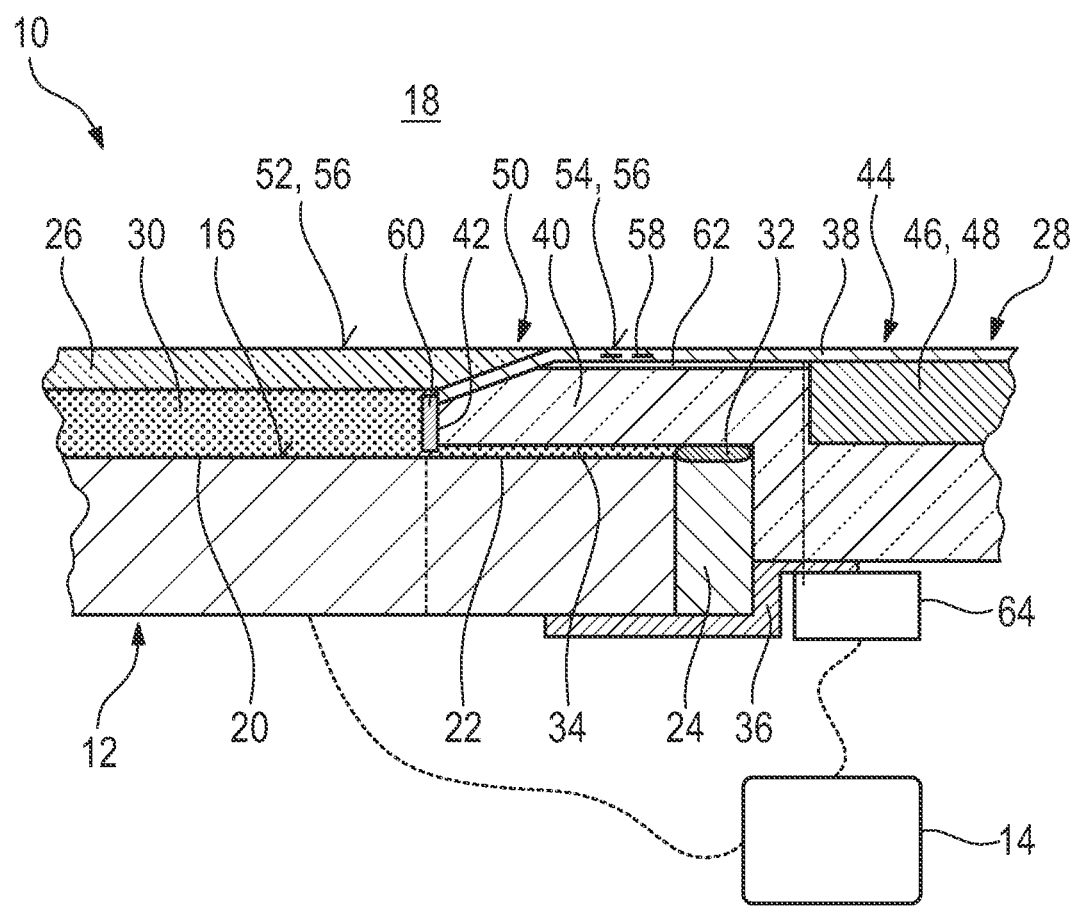
FIG. 1 shows a display device according to the disclosure in a schematic sectional view.
Figure 2:
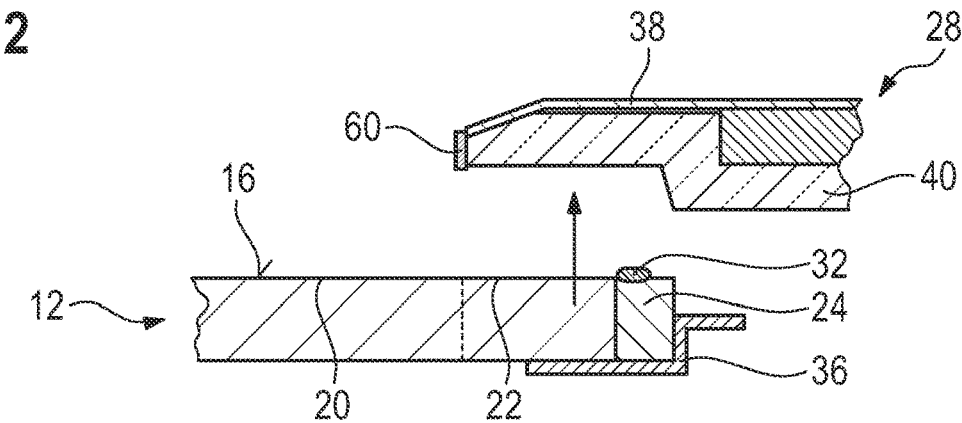
FIGS. 2 to 5 show a method of manufacturing the display device of FIG. 1.
Figure 3:
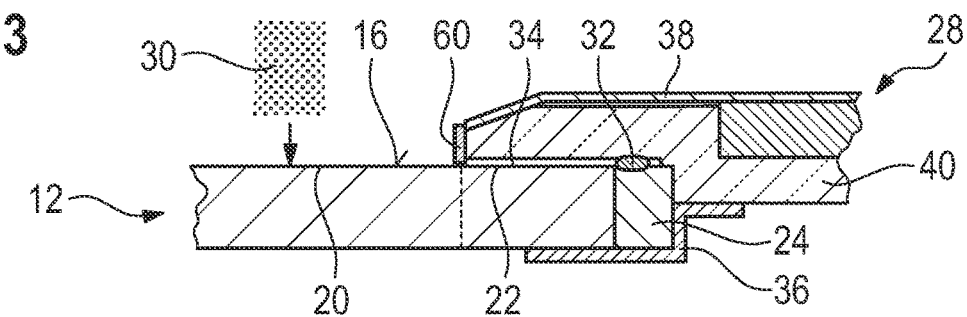
Figure 4:
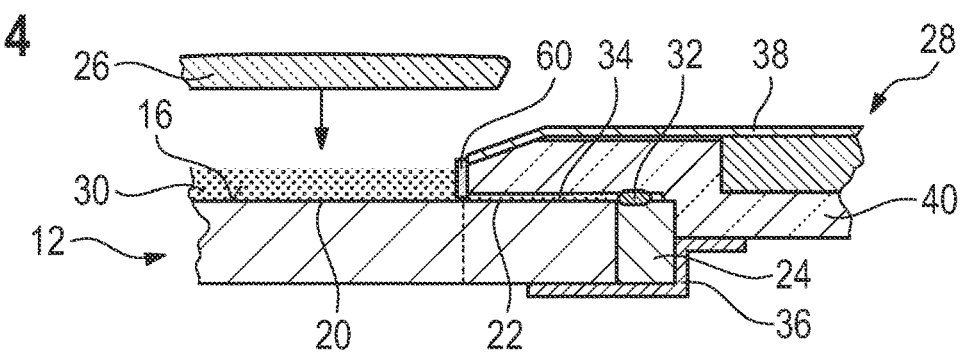
Figure 5:
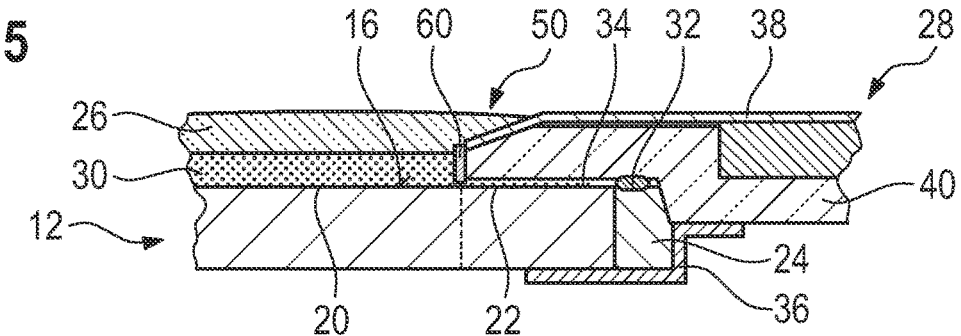

FIG. 1 shows a display device 10 for a vehicle, which has a screen 12 and a control unit 14. FIG. 1 shows only a part of the display device 10. It shows in particular a marginal area of the display device 10.

The marginal areas of the display device 10 which are not shown can be designed analogously to the marginal area shown.

The screen 12 has an active screen surface 16 arranged opposite a vehicle interior 18 and configured to provide image contents to vehicle occupants in the vehicle interior 18.

The screen surface 16 has a central main area 20 and a marginal area 22 adjacent the main area 20.

The marginal area 22 surrounds the main area 20 in an annular or rectangular shape.

In an alternative embodiment, the marginal area 22 surrounds the main area 20 at least in sections, in particular in sections in an annular or rectangular shape.

The control unit 14 is connected to the screen surface 16 in a signal-transmitting manner and is configured to provide image contents in both the main area 20 and the marginal area 22.

In one embodiment, the control unit 14 is part of, or forms, an on-board computer of the vehicle.

The screen 12 further has an inactive section 24 surrounding the screen surface 16 in a frame-like manner.

The inactive section 24 is, for example, an unused section of the active screen surface of the screen 12 or a frame or an enclosure of the screen 12.

In particular, the screen 12 is an LCD, TFT, LED, OLED, or QLED display.

The display device 10 further comprises a transparent protective layer 26 arranged opposite and completely covering the main area 20, and a mount 28 arranged opposite the marginal area 22.

In principle, the display device 10 may not include a protective layer 26 for the screen 12, particularly if the screen surface 16 is sufficiently robust and designed, for example, to be touched by an operator without being damaged.

In this case, the protective layer 26 and the mount 28 are bonded to the screen 12 via the screen surface 16 by use of a liquid optically clear adhesive (LOCA) 30.

Between the inactive section 24 and the mount 28, the display device 10 has a sealing element 32 which seals a gap 34 between the mount 28 and the screen surface 16 and thus prevents the liquid optically clear adhesive 30 from escaping via the gap 34.

The screen 12 is attached to the mount 28 using a fastening element 36, for example a retaining clip, which ensures a defined gap 34 and a reliable sealing by the sealing element 32.

The mount 28 has an exterior decorative layer 38 facing the vehicle interior 18, and a transparent support 40 extending between the marginal area 22 and the decorative layer 38.

The transparent support 40 has an edge 42 facing the main area 20, from which the transparent support 40 extends between the marginal area 22 and the decorative layer 38 and beyond the screen 12, thus forming an enclosure in which the screen 12 is received in a frame-like manner.

The transparent support 40 is formed of an optically clear plastic, for example.

In the illustrated embodiment, the support 40 tapers towards its edge at the front, i.e. it becomes progressively thinner towards the edge so that the front side thereof has a chamfer.

The decorative layer 38 extends from the edge 42 to an outer section 44 of the mount 28.

The outer section 44 preferably merges seamlessly with interior elements of the vehicle which are adjacent to the display device 10 or into which the display device 10 is integrated.

In the illustrated embodiment, the mount 28 includes a recess 46 in the outer section 44 in which a padding 48 is arranged below the decorative layer 38 to soften the surface in the outer section.

In an overlapping area 50 adjacent to the edge 42, the decorative layer 38 is directly adjacent to the protective layer 26 and is arranged in this overlapping area 50 between the protective layer 26 and the support 40. At its marginal area, the protective layer 26 has a chamfer on the rear side which corresponds in angle to the chamfer of the support 40. The decorative layer 38 also extends between these areas with the chamfers.

The side 52 of the protective layer 26 facing the vehicle interior 18 and the exposed side 54 of the decorative layer 38 facing the vehicle interior 18 are even with each other, as a result of which the surface 56 of the display device 10 facing the vehicle interior 18 is configured to be flat and the protective layer 26 merges smoothly into the decorative layer 38.

In principle, the protective layer 26 can merge into the decorative layer 38 in any manner, but the two layers 26, 38 are preferably directly adjacent to each other.

In an alternative embodiment, the protective layer 26 is adjacent to the decorative layer 38 in a flush manner without an overlapping area 50 with the chamfers where the decorative layer 38 is arranged between the protective layer 26 and the support 40.

Additionally or alternatively, the decorative layer 38 may extend beyond the protective layer 26 into the vehicle interior 18 so that the side 52 of the protective layer 26 facing the vehicle interior 18 and the exposed side 54 of the decorative layer 38 facing the vehicle interior 18 are not planar but offset from each other perpendicularly to the screen surface 16. In other words, the transition from the protective layer 26 to the decorative layer 38 has a step.

The decorative layer 38 has a transparency of less than 50% in the visible spectral range, as a result of which in the switched-off state, the marginal area 22 is substantially invisible to a vehicle occupant through the decorative layer 38 from the vehicle interior 18. However, light emitted from the screen 12 via the marginal area 22 is visible through the decorative layer 38. That is, the decorative layer 38 obscures the screen 12 in an opaque manner in the marginal area 22 as long as no light is emitted via the marginal area 22.

Adjacent to the protective layer 26 and opposite the marginal area 22, masking elements 58 having respectively associated image elements and by which part of the light emitted via the marginal area 22 is shielded from the vehicle interior 18 are arranged in the decorative layer 38. If the masking elements 58 are illuminated by the marginal area 22, the corresponding image elements are visible from the vehicle interior 18 through the decorative layer 38.

In an alternative embodiment, the masking elements 58 may be arranged at any location between the decorative layer 38 and the marginal area 22.

The masking elements 58 are optional, i.e. they may be omitted in an alternative embodiment.

Additionally or alternatively, image contents may be formed directly through the marginal area 22, particularly at locations where no masking elements 58 are provided.

The embodiment shown here includes areas of the decorative layer 38 without a masking element 58 through which a light emitting display is directly visible in the marginal area 22, and areas with a masking element 58 in which the decorative layer 38 covers an image element of the masking element 58.

In the areas without a masking element 58, the decorative layer 38 has a transparency of 40%.

In an alternative embodiment, the transparency of the decorative layer 38 in the areas without a masking element 58 may be between 15% and 50%, preferably between 35% and 45%.

In the areas with a masking element 58, the decorative layer 38 has a transparency of 4%.

Alternatively, the transparency of the decorative layer 38 in the areas with a masking element 58 may be less than 15%, in particular between 2% and 8%.

To prevent light from the main area 20 from falling on and illuminating the decorative layer 38, the mount 28 includes a light-proof layer 60 at the edge 42 which shields the edge 42 and the decorative layer 38.

The mount 28 further includes pressure-sensitive switching elements 62 associated with corresponding sections of the marginal area 22 or corresponding masking elements 58, to serve as input elements at those locations.

In the illustrated embodiment, the electrical, e.g., foil-like switching elements 62 are formed as a layer arranged immediately below the decorative layer 38 between the marginal area 22 and the decorative layer 38.

In an alternative embodiment, the switching elements 62 may of course be formed in any shape.

Furthermore, the switching elements 62 may be integrated at least in sections into the decorative layer 38.

Additionally or alternatively, the switching elements 62 may be touch-sensitive.

In all cases, the switching elements 62 preferably have a high transparency in the visible spectral range in order to shield the light emitted by the marginal area 22 as little as possible from the vehicle interior 18.

In the illustrated embodiment, the display device 10 has a control 64 in the form of a printed circuit board for the switching elements 62, by which the switching elements 62 are connected to the control unit 14 in a signal-transmitting manner.

In principle, the switching elements 62 can be connected directly to the control unit 14 in a signal-transmitting manner, as a result of which the control 64 can be omitted.

With reference to FIGS. 2 to 5, a method will now be described by which the display device 10 can be manufactured.

In a first step (see FIG. 2), the screen 12 is fixed to the mount 28 with the fastening element 36 such that the sealing element 32 seals the gap 34 between the marginal area 22 and the support 40.

In a next step (see FIG. 3), the liquid optically clear adhesive 30 is applied to the main area 20 of the screen surface 16. The liquid optically clear adhesive 30 flows at least in sections into the gap 34 and thus provides a good optical transition between the marginal area 22 and the support 40. Here, a good optical transition is understood to mean that the light is not refracted or is only slightly refracted during the transition from one material to an adjacent material, and thus image contents are displayed as faithfully as possible for a vehicle occupant in the vehicle interior 18.

In a subsequent step (see FIG. 4), the protective layer 26 is applied and bonded to the screen 12 via the still liquid optically clear liquid adhesive 30.

In a final step (see FIG. 5), the liquid optically clear adhesive 30 is cured.

In this way, a display device 10 is provided which can be integrated particularly harmoniously into the interior design of a vehicle.

In particular, the display device 10 does not have a frame which would be visible from the vehicle interior 18; rather, the protective layer 26 of the screen 12 merges directly into the decorative layer 38.

As the decorative layer 38 leaves the main area 20 free, that is, does not cover the latter with respect to the vehicle interior 18, image contents displayed in the main area 20 are visible to vehicle occupants with particularly high quality.

The marginal area 22 is further arranged to make image contents visible through the decorative layer 38 as required, for example in the form of display elements and/or illuminated control elements which can be used as input elements by a vehicle occupant directly at the corresponding location in the decorative layer 38 via the switching elements 62.

In this way, a driver can be effectively assisted by displaying display and/or control elements that are important at the moment, while other display and/or control elements remain invisible.

The disclosure is not limited to the embodiment shown. In particular, individual features of one embodiment can be combined as desired with features of other embodiments, in particular irrespective of the other features of the corresponding embodiments.

The invention claimed is:

1. A display device for vehicle interiors, comprising:
   a screen having an active front screen surface comprising a main area and a marginal area; and
   a decorative layer covering the marginal area and not covering the main area, wherein the decorative layer is configured such that in a non-switched-on state of the screen in the marginal area, the marginal area is not visible through the decorative layer, and in a switched-on state of the marginal area, light emitted from the marginal area is visible through the decorative layer.

2. The display device according to claim 1, wherein the display device has a transparent protective layer for the screen which extends over the main area and is directly adjacent to the decorative layer.

3. The display device according to claim 1, wherein the display device has one or more touch-sensitive and/or pressure-sensitive switching elements which are arranged between the decorative layer and the marginal area and/or are integrated into the decorative layer in an area opposite the marginal area.

4. The display device according to claim 1, wherein the display device has one or more masking elements which are arranged between the decorative layer and the marginal area and/or are integrated into the decorative layer in an area opposite the marginal area, the one or more masking elements being configured to partially shield light emitted by the marginal area from the decorative layer.

5. The display device according to claim 1, wherein the decorative layer has a transparency of between 15% and 50% in a visible spectral range.

6. The display device according to claim 1, wherein the display device has a transparent support which is arranged at least in sections between the decorative layer and the active front screen surface.

7. The display device according to claim 1, including a control unit that is connected to the active front screen surface in a signal-transmitting manner and which is configured to provide image content in both the main area and the marginal area.

8. The display device according to claim 1, including one or more pressure-sensitive switching elements associated with corresponding sections of the marginal area.

9. The display device according to claim 2, wherein the transparent protective layer overlaps with the decorative layer such that the decorative layer is arranged in an overlapping area between the transparent protective layer and the active front screen surface.

10. The display device according to claim 4, wherein in the area of the one or more masking elements, the decorative layer has a transparency of at most 15% in a visible spectral range.

11. The display device according to claim 6, wherein the transparent support forms an enclosure for the screen.

12. The display device according to claim 6, wherein the display device has a sealing element which seals a gap between the screen and the transparent support.

13. The display device according to claim 12, wherein the sealing element is arranged between the decorative layer and a side of the screen which has the active front screen surface.

14. A method of manufacturing a display device to for vehicle interiors, comprising:
   a screen having an active front screen surface comprising a main area and a marginal area;
   a decorative layer covering the marginal area and not covering the main area, wherein the decorative layer is configured such that in a non-switched-on state of the screen in the marginal area, the marginal area is not visible through the decorative layer, and in a switched-on state of the marginal area, light emitted from the marginal area is visible through the decorative layer;
   wherein the display device has a transparent support which is arranged at least in sections between the decorative layer and the active front screen surface; and wherein the display device has a sealing element which seals a gap between the screen and the transparent support; and the method comprising the steps of:

(a) applying an optically clear liquid adhesive to the active front screen surface, the optically clear liquid adhesive flowing at least in sections into the gap between the screen and the transparent support; and b) attaching a transparent protective layer for the screen, which extends over the main area and which is directly adjacent to the decorative layer, by bonding the transparent protective layer to the screen via the previously applied optically clear liquid adhesive.

15. A display device for vehicle interiors, comprising:

a screen having an active front screen surface comprising a main area and a marginal area;

a decorative layer covering the marginal area and not covering the main area;

wherein the decorative layer is configured such that in a non switched-on state of the screen in the marginal area, the marginal area is not visible through the decorative layer, and in a switched-on state of the marginal area, light emitted from the marginal area is visible through the decorative layer; and wherein the active front screen surface is an active area of the screen, which is designed to display image content and faces a viewer or a vehicle interior.

16. The display device according to claim 15, including a control unit that is connected to the active front screen surface in a signal-transmitting manner and which is configured to provide image content in both the main area and the marginal area.

17. The display device according to claim 15, including one or more pressure-sensitive switching elements associated with corresponding sections of the marginal area.

18. The display device according to claim 17, wherein the marginal area makes image content visible through the decorative layer in a form of display elements and/or illuminated control elements that comprise input elements that are selectable by a vehicle occupant directly at a corresponding location in the decorative layer via the one or more pressure-sensitive switching elements.

19. The display device according to claim 8, wherein the marginal area makes image content visible through the decorative layer in a form of display elements and/or illuminated control elements that comprise input elements that are selectable by a vehicle occupant directly at a corresponding location in the decorative layer via the one or more pressure-sensitive switching elements.

* * * * *